(12) United States Patent
Ise et al.

(10) Patent No.: US 6,180,435 B1
(45) Date of Patent: Jan. 30, 2001

(54) SEMICONDUCTOR DEVICE WITH ECONOMICAL COMPACT PACKAGE AND PROCESS FOR FABRICATING SEMICONDUCTOR DEVICE

(75) Inventors: Hiroshi Ise; Toshiaki Shironouchi, both of Tokyo (JP)

(73) Assignee: NEC Corporation (JP)

( * ) Notice: Under 35 U.S.C. 154(b), the term of this patent shall be extended for 0 days.

(21) Appl. No.: 09/338,087

(22) Filed: Jun. 23, 1999

(30) Foreign Application Priority Data

Jun. 24, 1998 (JP) .................................................. 10-177565

(51) Int. Cl.7 .................................................. H01L 21/44
(52) U.S. Cl. .......................... 438/113; 438/112; 438/458; 438/460
(58) Field of Search .................... 438/112, 113, 438/458, 460, 461, 462, 463, 464, 465

(56) References Cited

U.S. PATENT DOCUMENTS 5,547,906 * 8/1996 Badehi .................................. 438/460
5,776,798 * 7/1998 Quan et al. ........................... 438/112
5,824,177 * 10/1998 Yoshihara et al. ................... 438/464
5,948,233 * 9/1999 De Samber et al. ................. 438/113
5,950,070 * 9/1999 Razon et al. ......................... 438/113
5,989,982 * 11/1999 Yoshikazu ........................... 438/462
6,004,833 * 12/1999 Kovats et al. ....................... 438/460

FOREIGN PATENT DOCUMENTS

| 5-55278 | 3/1993 | (JP) . |
| 6-244313 | 9/1994 | (JP) . |
| 8-335596 | 12/1996 | (JP) . |
| 9-252065 | 9/1997 | (JP) . |
| 11-152632 | 6/1999 | (JP) . |

* cited by examiner

Primary Examiner—Kevin M. Picardat
(74) Attorney, Agent, or Firm—Hayes, Soloway, Hennessey, Grossman & Hage, P.C.

(57) ABSTRACT

Semiconductor chips are arranged on a panel in matrix, scaled in a piece of synthetic resin through a transfer molding, and the resultant structure is separated into dices through a cutting operation so that small semiconductor devices are economically produced.

13 Claims, 12 Drawing Sheets

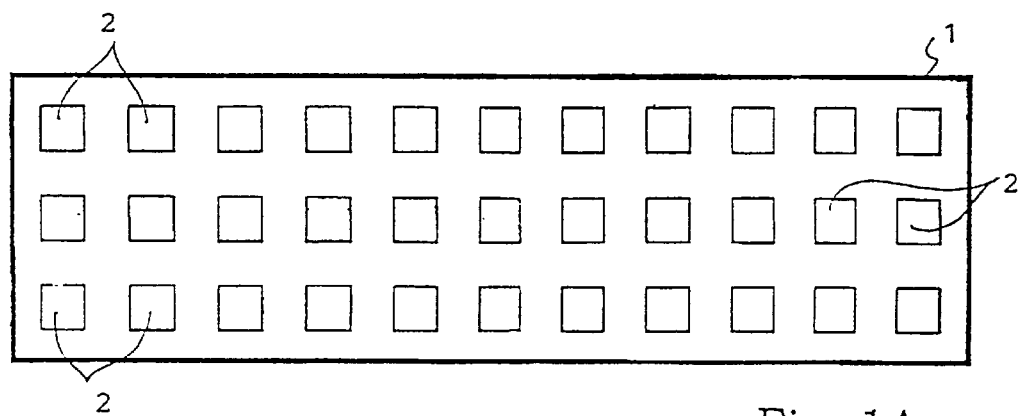
Fig. 1A
PRIOR ART
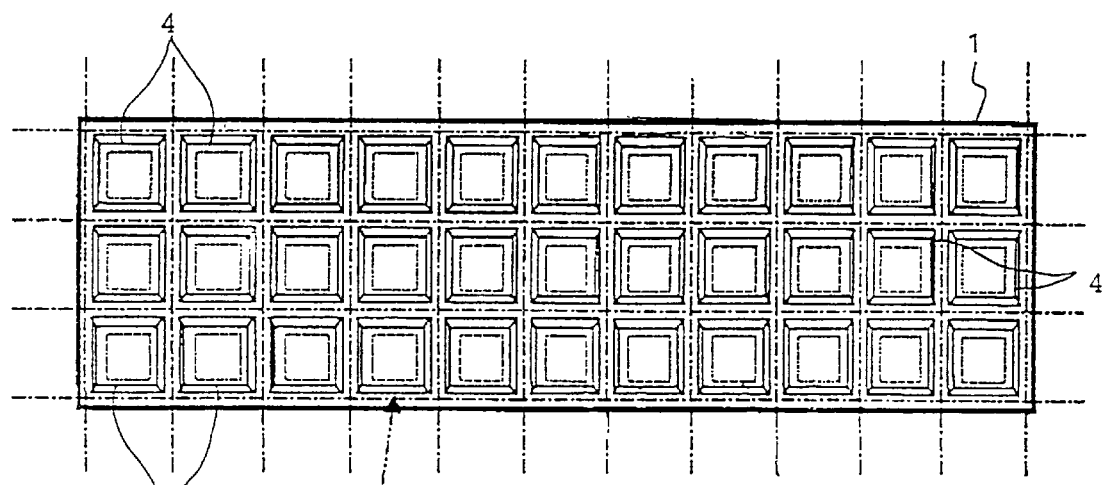
Fig. 1B
PRIOR ART
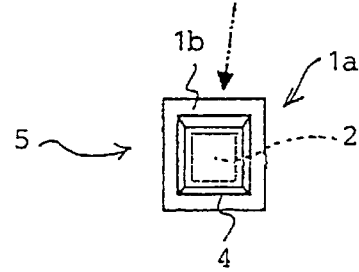

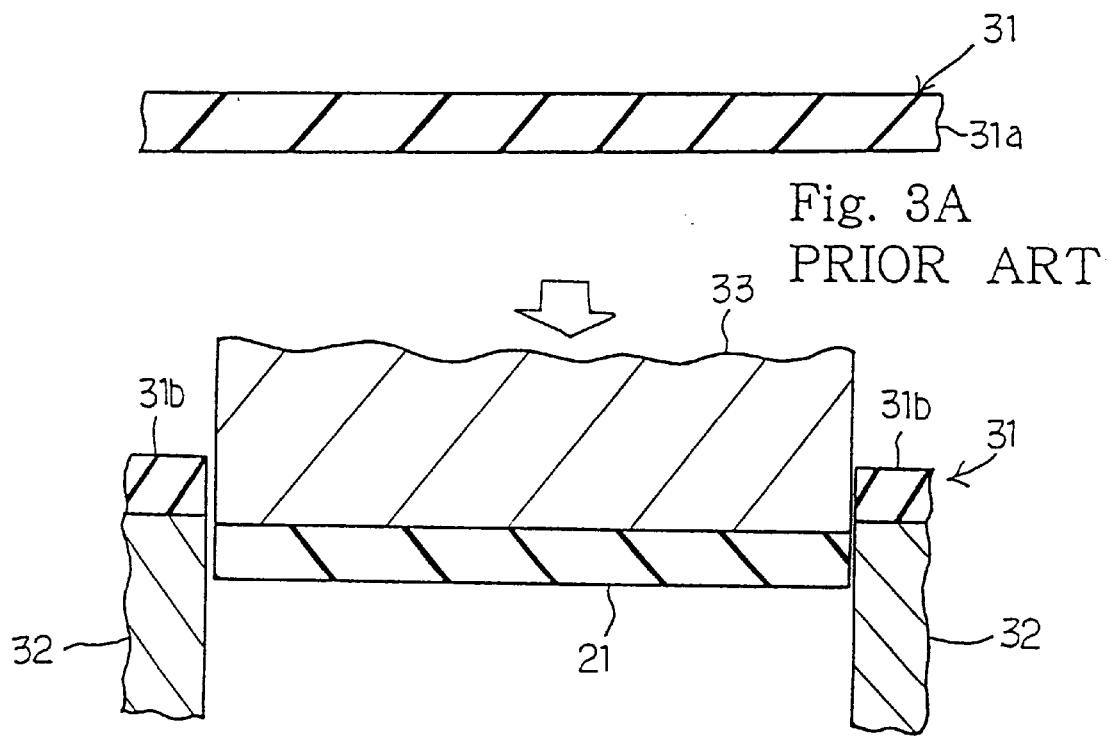
Fig. 3A PRIOR ART
Fig. 3B PRIOR ART
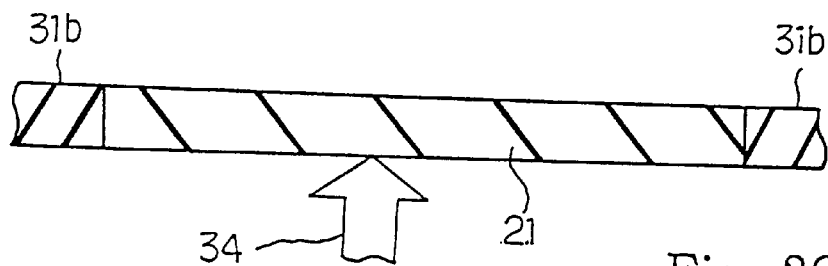
Fig. 3C PRIOR ART

SEMICONDUCTOR DEVICE WITH ECONOMICAL COMPACT PACKAGE AND PROCESS FOR FABRICATING SEMICONDUCTOR DEVICE

FIELD OF THE INVENTION

This invention relates to assembling technologies for a semiconductor device and, more particularly, to a semiconductor device with an economical compact package and a process for assembling a semiconductor device.

DESCRIPTION OF THE RELATED ART

Various kinds of package are used for semiconductor devices. A tape ball grid array packages, a plastic ball grid array package, a fine pitch ball grid array package and a chip size package are examples of known packages. A surface-mounting package such as the plastic ball grid array package and the chip size package has a ball grid array directly connected to a circuit board, and is appropriate for miniature electric products.

A typical example of the prior art process for the surface-mounting package is illustrated in FIGS. 1A to 1E. First, an insulating plate 1 is prepared.

The insulating plate 1 is a sheet of glass fiber reinforced epoxy resin, which is called as "glass-epoxy substrate", or is a polyimide tape. Though not shown in the FIG. 1A, a conductive pattern of copper is repeatedly formed in small regions on the major surface of the insulating plate 1, and the small regions are arranged in matrix. Plural semiconductor chips 2 are bonded to the small regions of the insulating plate 1, and the conductive pattern in a each small region is electrically connected through conductive wires to bonding pads of the associated semiconductor chip 2.

The semiconductor chips 2 arranged on the insulating plate 1 are placed in a molding die (not shown), and synthetic resin is introduced into the cavities of the molding die. The semiconductor chips 2 are sealed with pieces of the synthetic resin, respectively, and the pieces of synthetic resin serve as the plastic packages 4. The insulating plate 1 is taken out from the molding die, and is to be cut into the prior art semiconductor devices 5 along dot-and-dash lines shown in FIG. 1B as will be described hereinlater. The cutting lines define square substrates 1a, and the square substrate 1a is wider than the plastic package 4. In other words, a margin 1b is given to the square substrate 1a.

The insulating plate 1 is conveyed to a cutting machine. The cutting machine has a die unit 12, and an upper die 12a and a lower die 12b form in combination the die unit 12 (see FIG. 1C). The upper die 12a has a punch 12c, and the punch 12c is slidable along holes formed in a guide member 12d. The holes are separated from one another by means of pads 12e so as to locate the punch 12c along the dot-and-dash lines. On the other hand, the lower die 12b has a die portion 12f connected by means of pads 12f. Holes are also formed in the die portions 12f, and are respectively aligned with the holes formed in the guide members 12d. The upper die 12a is spaced from the lower die 12b, and the insulating plate 1 is inserted into the gap between the upper die 12a and the lower die 12b as shown in FIG. 1C.

The upper die 12a is downwardly moved, and the insulating plate 1 is pinched between the guide member 12d and the die portion 12f as shown in FIG. 1D. The punch 12c is pressed against the insulating plate 1, and cuts the insulating plate 1 into the square substrates 1a as shown in FIG. 1E.

As described hereinbefore, the insulating plate 1 is formed of the glass fiber reinforced epoxy resin or polyimide. In order to cut the insulating plate into the square substrates 1a, it is necessary to pinch the insulating plate 1 between the guide members 12d and the die portions 12f, and the area to be pinched is wider than the cross section of the punch 12c. The difference is left on the square substrate 1a as the margin 1b.

The pressure applied to the punch 12c is dependent on the tensile strength of the insulating plate 1. On the other hand, the smallest package is cut by using the punch 12c as narrow as 0.2 millimeter. However, such a thin punch 12c is liable to buckle in the punching due to the large pressure to be required for the glass fiber reinforced epoxy resin or the polyimide tape. If the manufacturer uses a wide punch 12c without increasing the area to be pinched, the plastic packages 4 tend to be damaged due to the pitching. Therefore, a fairly thick punch 12c and a wide area to be pinched are necessary for the prior art process, and the wide margin 1b is left on the square substrate 1a. The wide margin 1b makes the prior art semiconductor device large, and this is the first problem inherent in the prior art semiconductor device.

The second problem is the production cost. The glass fiber reinforced epoxy resin and the polyimide tape are expensive. As described hereinbefore, the wide margin 1b is indispensable, and the glass fiber reinforced epoxy resin or the polyimide tape for the margin 1b is wasteful. In other words, the manufacturer merely puts a small number of semiconductor chips 2 on a single sheet of the glass fiber reinforced epoxy resin or a single polyimide tape. This results in high production cost.

A solution is disclosed in Japanese Patent Publication of Unexamined Application No. 9-252065. FIG. 2 illustrates the prior art semiconductor device disclosed in the Japanese Patent Publication of Unexamined Application. The prior art semiconductor device comprises an insulating frame 21, a semiconductor chip 22, ball bumps 23 and a plastic package 24. A piece of glass fiber reinforced epoxy resin or a piece of polyimide tape is available for the insulating frame 21. When the piece of polyimide tape is used as the insulating frame, it is cut from a long polyimide tape. Via holes 21a are formed in the insulating frame 21, and a conductive pattern 21b is formed on a major surface and a reverse surface of the insulating frame 21. The conductive pattern 21b is formed of copper. The conductive pattern 21b on the major surface is electrically connected to the conductive pattern 21b on the reverse surface through the via holes 21a. The conductive pattern 21b on the major surface is partially covered with an insulating layer 25, and is exposed to holes 25a formed in the insulating layer 25. The semiconductor chip 22 is bonded to the insulating layer 25 by means of adhesive compound 26, and bonding pads 22a of the semiconductor chip 22 are connected through conductive wires 27 to the conductive pattern 21b exposed to the holes 25a, respectively. The conductive pattern 21b on the reverse surface is also partially converted with an insulating layer 28, and is exposed to holes formed in the insulating layer 28. The ball bumps 23 are bonded to the conductive pattern 21b exposed to the insulating layer 28. The semiconductor chip 22, the bonding wires 27 and a central area of the insulating layer 25 are sealed in the plastic package 24.

Although the Japanese Patent Publication of Unexamined Application admits that the edges 24a of the plastic package 24 may be retracted from the side surfaces 21c of the insulating frame 21 by 0.1 millimeter or less, the Japanese Patent Publication of Unexamined Application asserts that the edges 24a are substantially aligned with the side surfaces 21c.

A prior art process for fabricating the semiconductor device is described with reference to FIGS. 3A–3F. First, a printed circuit panel 31 is prepared as shown in FIG. 3A. The conductive pattern 21b has been repeatedly printed on an insulating plate 31a of glass fiber reinforced epoxy resin or polyimide, and the conductive pattern 21b (not shown in FIGS. 3A–3F) as a whole constitute the printed circuit panel 31. The circuit frame 21a/21b is a part of the insulating plate 31a.

The printed circuit panel 31 is placed on a die 32. A punch 33 is pressed against the printed circuit panel 31, and cuts the circuit frame 21a/21b from the printed circuit panel 31 as shown in FIG. 3B. A scrap 31b is left on the die 32, and the punch 33 is spaced from the circuit frame 21a/21b.

Subsequently, force 34 is upwardly exerted on the circuit frame 21a/21b, and the circuit frame 21a/21b is pushed back into the scrap 31b as shown in FIG. 3C. The circuit frame 21a/21b does not drop out from the scrap 31b. However, a suitable temporary fastening means may be formed in the scrap 31b.

Subsequently, the semiconductor chip 22 is bonded to the circuit frame 21a/21b pushed back into the scrap 31b, and the conductive wires 27 electrically connect the bonding pads 22a to the conductive pattern. After the wire bonding, the semiconductor chip 22 bonded to the circuit frame 21a/21b is placed in a cavity 35 formed in a molding die 36 (see FIG. 4), and molten resin is introduced into the cavity 35. The semiconductor chip 22 is sealed in the plastic package 24, and the resultant structure is taken out from the molding die as shown in FIG. 3E.

The solder balls 23 are formed on the reverse surface of the circuit frame 21a/21b (see FIG. 3F), and the semiconductor device shown in FIG. 2 is completed. Upon completion, the semiconductor device is separated from the scrap 31b.

Thus, the semiconductor chip 22 is mounted on the circuit frame 21a/21b temporarily fastened to the scrap 31b, and, thereafter, the resultant semiconductor device is separated from the scrap 31b. As shown in FIG. 3B, the punch 33 has the bottom surface as wide as the circuit frame 21a/21b, and never buckles. Any margin is theoretically required for the molding work, and the molding die 36 makes the plastic package 24 aligned with the side surfaces 21c of the circuit frame 21a/21b. This results in that the prior art semiconductor device becomes compact. However, the scrap 31b is still left on the die 32. This means that the manufacturer cannot sufficiently reduce the production cost of the prior art semiconductor device through the process disclosed in the Japanese Patent Publication of Unexamined Application.

As described hereinbefore, the semiconductor chip 22 is scaled in the plastic package 24 through the molding, and the configuration of the cavity 35 is transferred to the plastic package 24. The cavity 35 is defined by the inner wall of the die 36). The inner wall is oblique so that an operator easily takes out the semiconductor device from the molding die 36. However, the oblique side surfaces of the plastic package 24 cause the bottom surface to occupy the circuit frame 21a/21b wider than the top area of the plastic package 24. Thus, the tapered plastic package 24 is wasteful, and makes the prior art semiconductor device still large.

Another prior art semiconductor device is disclosed in Japanese Patent Publication of Unexamined Application No. 6-244313. FIG. 5 illustrates the prior art semiconductor device disclosed in Japanese Patent Publication of Unexamined Application No. 6-244313. Scratch lines 41 are formed in a semiconductor wafer 42, and define semiconductor chips 42a. The semiconductor chip 42a is bonded to a polyimide tape 43, and bonding pads (not shown) on the semiconductor chip 42a are connected through conductive wires (not shown) to leads 44. The semiconductor chip 42a is sealed in a piece of synthetic resin through a molding, and the piece of synthetic resin is formed into a plastic package 45. The boundaries between the plastic packages 45 are constricted over the scribe lines 41, and the semiconductor devices are separated along the constricted portions.

Japanese Patent Publication of Unexamined Application No. 6-244313 is silent to how the polyimide tapes 43 are separated, and it is unclear that any scrap occurs. However, the Japanese Patent Publication clearly says that the semiconductor chips 42a are sealed in the synthetic resin through the molding. Therefore, the configuration of the cavity is transferred to the plastic package 45, and has tapered side surfaces. For this reason, the same problem is encountered in the prior art semiconductor device disclosed in the Japanese Patent Publication of Unexamined Application.

SUMMARY OF THE INVENTION

It is therefore an important object of the present invention to provide a semiconductor device, which is compact.

It is also an important object of the present invention to provide a process for economically fabricating the semiconductor device.

To accomplish the object, the present invention proposes to cut a package panel into semiconductor devices after scaling semiconductor chips into a piece of synthetic resin.

In accordance with one aspect of the present invention, there is provided a semiconductor device comprising a substrate including an insulating layer and a conductive pattern formed on the insulating layer, a semiconductor chip mounted on the substrate and electrically connected to the conductive pattern and a piece of insulating material covering the semiconductor chip and having side surfaces substantially perpendicular to the substrate.

In accordance with another aspect of the present invention, there is provided a process for fabricating a semiconductor device comprising the steps of a) arranging semiconductor chips on a panel, b) covering the semiconductor chips with a piece of synthetic resin so as to produce a package panel and c) separating the package panel into semiconductor devices.

BRIEF DESCRIPTION OF THE DRAWINGS

The features and advantages of the semiconductor device and the process will be more clearly understood from the following description taken in conjunction with the accompanying drawings in which:

FIGS. 1A to 1E are views showing the process for fabricating the prior art semiconductor device;

FIGS. 3A to 3F are views showing the process for fabricating the prior art semiconductor device;

DESCRIPTION OF THE PREFERRED EMBODIMENT

Figure 6:
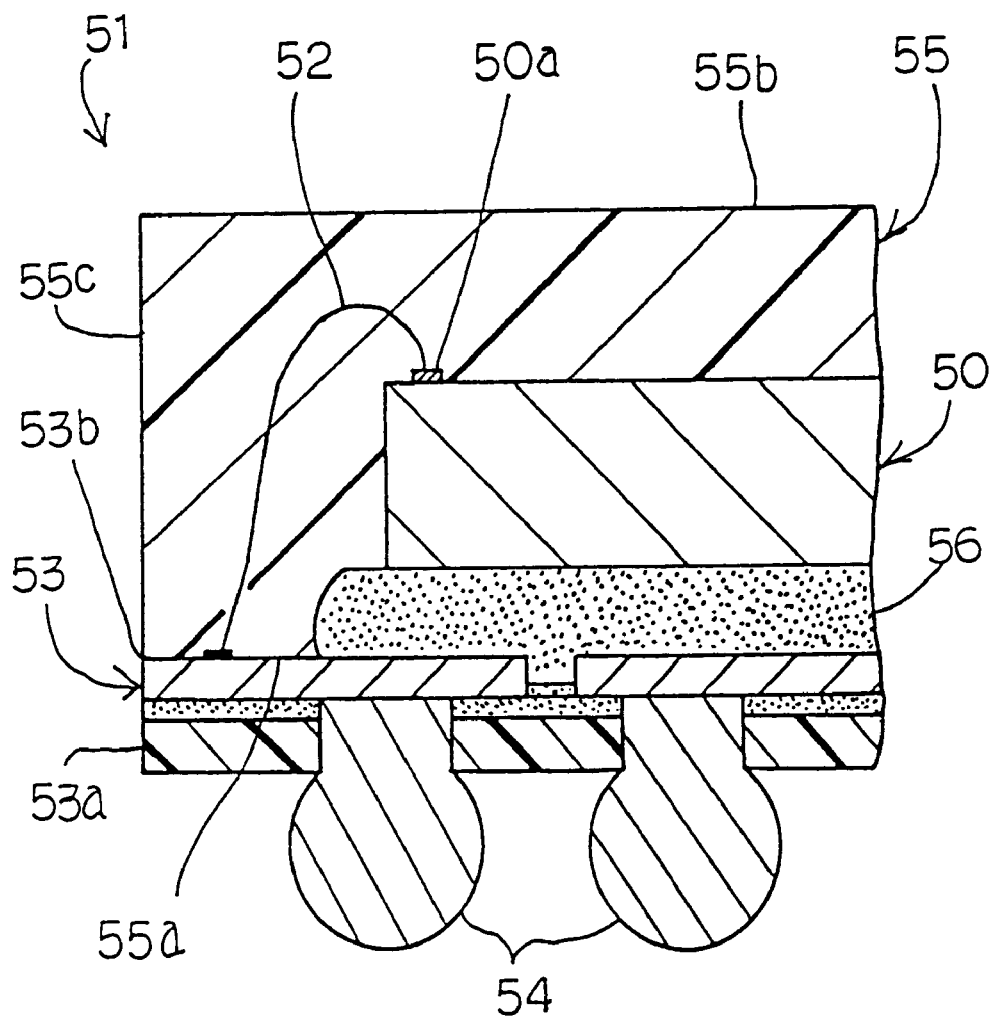
FIG. 6 is a cross sectional view showing the structure of a semiconductor device according to the present invention.

FIG. 6 illustrates a semiconductor device embodying the present invention, and the semiconductor device largely comprises a semiconductor chip 50, a package 51 and conductive wires 52. Though not shown in FIG. 6, circuit components and wiring are incorporated in the semiconductor chip 50, and form an integrated circuit. The integrated circuit is connected to bonding pads 50a, and only one bonding pad 50a is shown in FIG. 6.

The package 51 is broken down into a substrate 53, ball bumps 54 and a piece of synthetic resin 55. The synthetic resin is dielectric. The substrate 53 includes an insulating tape 53a such as, for example, polyimide and a conductive pattern 53b of copper adhered to the insulating tape 53a. Though-holes are formed in the insulating tape 53a, and the conductive pattern 53b is exposed to the reverse surface of the insulating tape 53a. The ball bumps 54 pass through the through-holes, and are connected to the conductive pattern 53b. The conductive pattern 53b is connected through the conductive wires 52 to the bonding pads 50a. The semiconductor chip 50 is fixed to the substrate 53 by means of an adhesive compound layer 56.

Figure 1C:
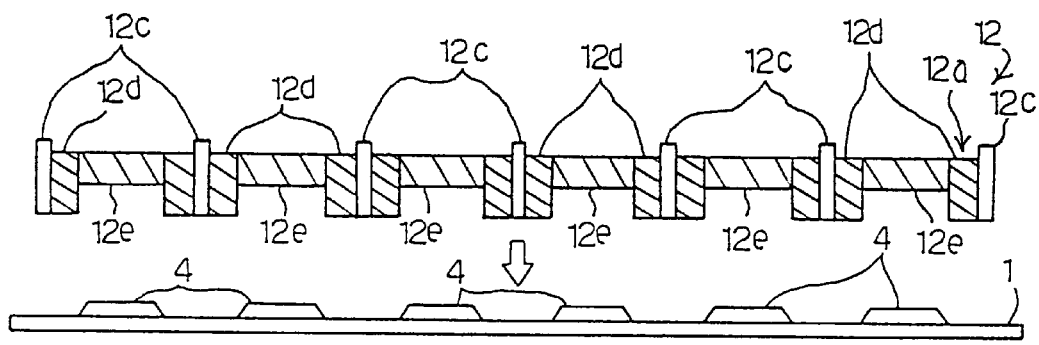
Figure 1D:
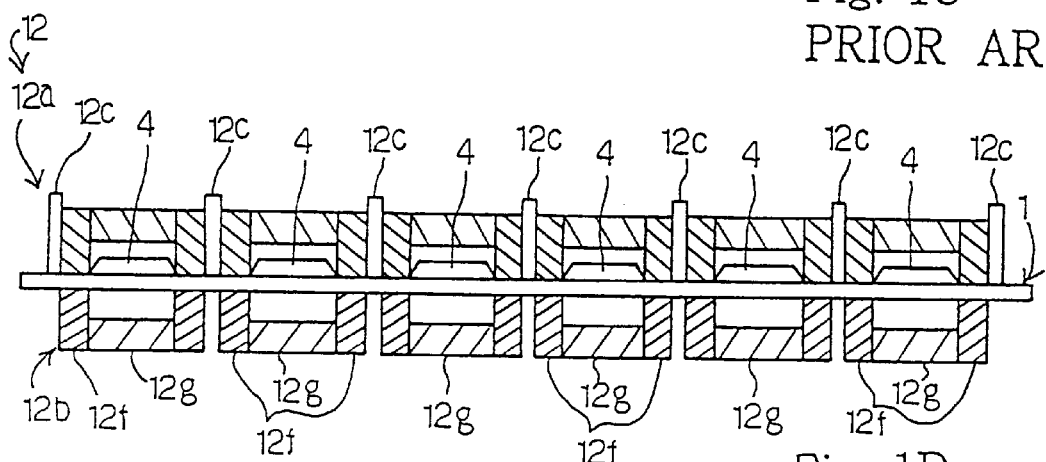
Figure 1E:
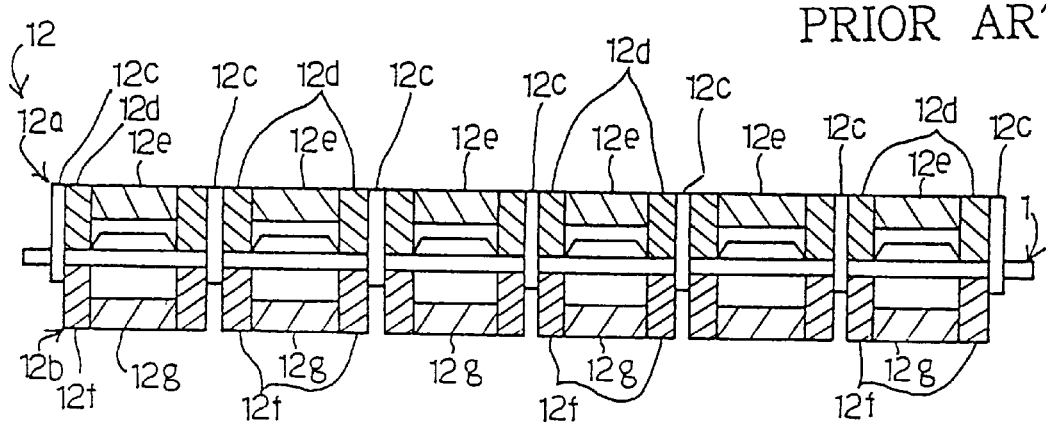
Figure 2:
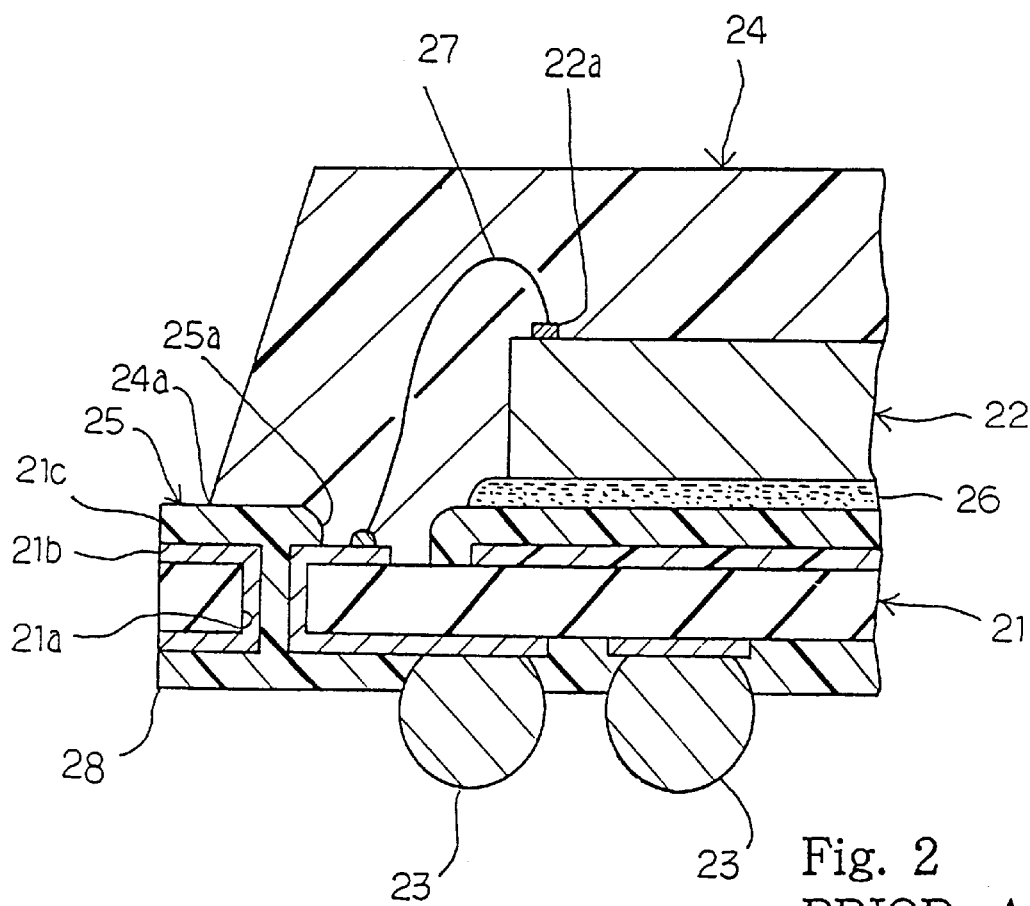
FIG. 2 is a cross sectional view showing the prior art semiconductor device disclosed in Japanese Patent Publication of Unexamined Application No. 9-252065.
Figure 3D:
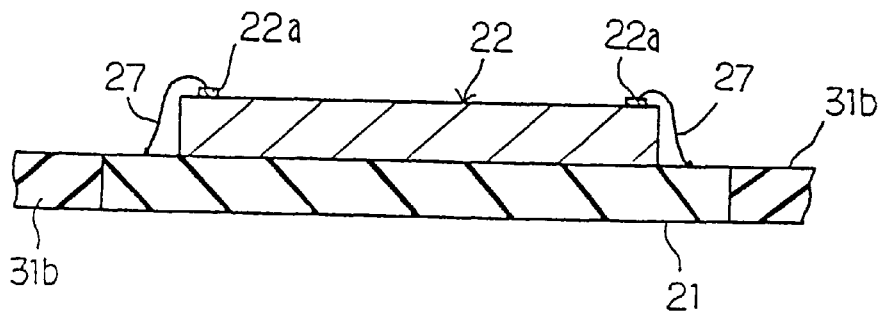
Figure 3E:
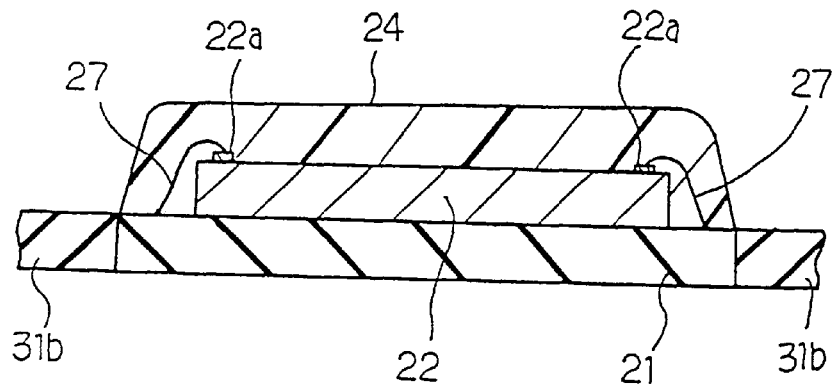
Figure 3F:
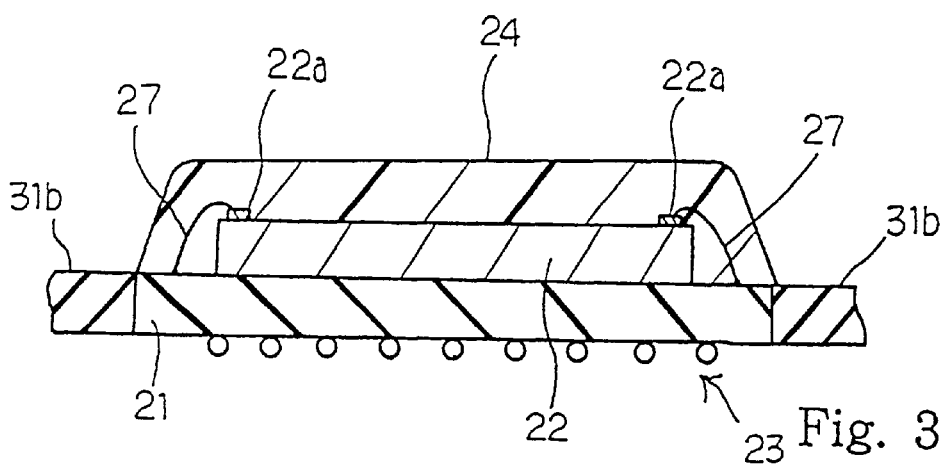
Figure 4:
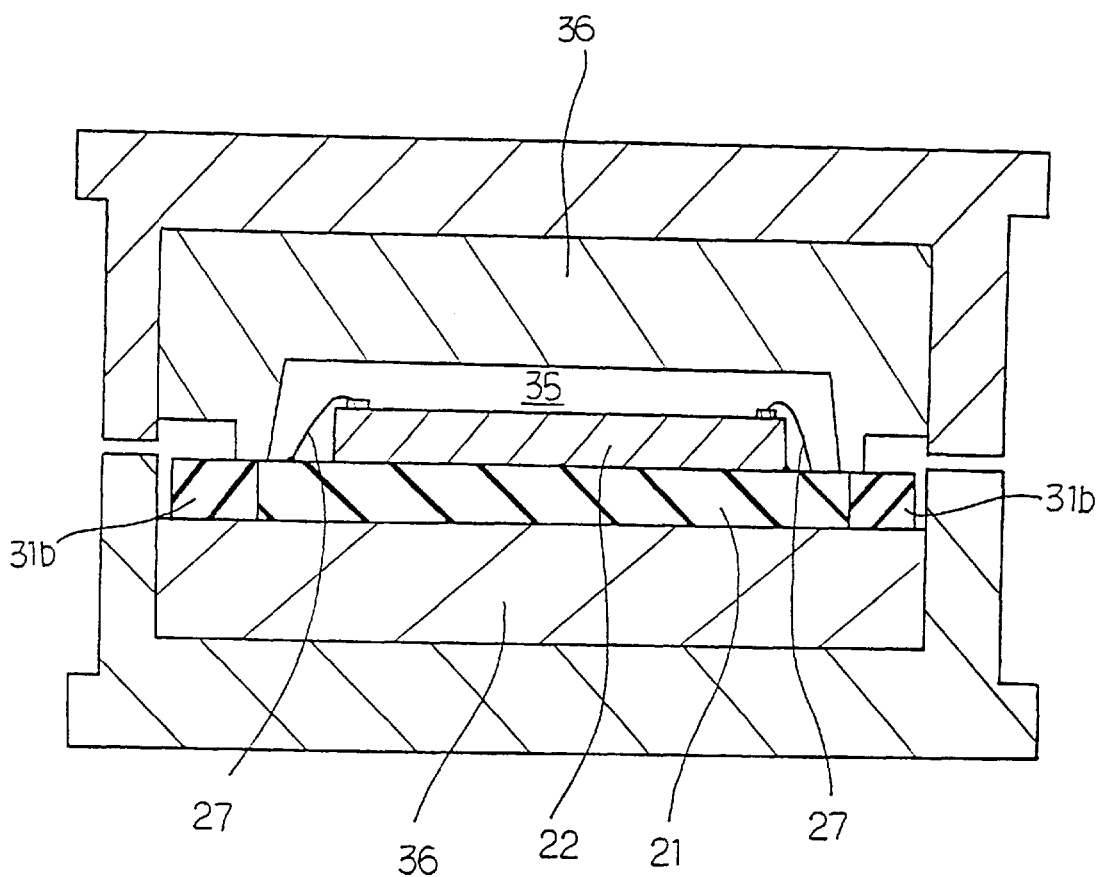
FIG. 4 is a cross sectional view showing the molding die used in the prior art process.
Figure 5:
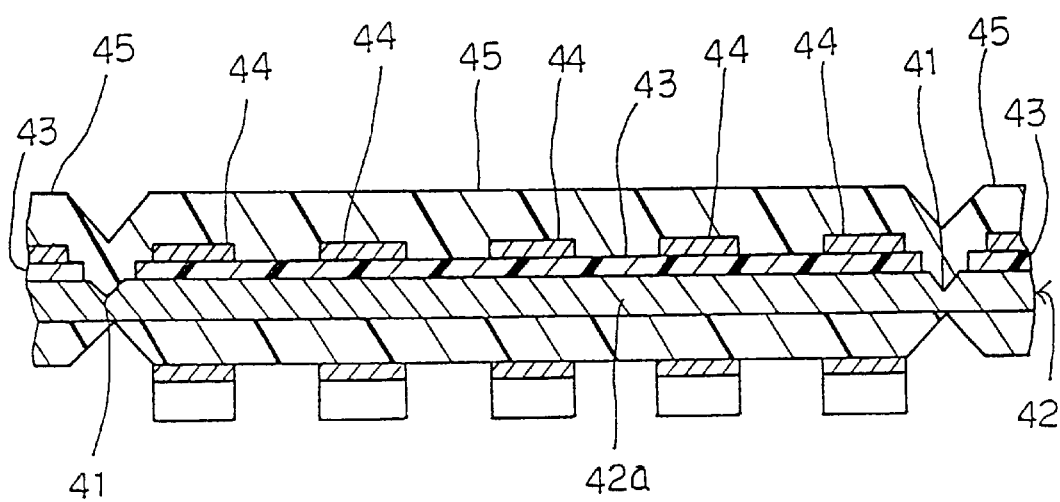
FIG. 5 is a cross sectional view showing the prior art semiconductor device disclosed in Japanese Patent Publication of Unexamined Application No. 6-244313.
Figure 7:
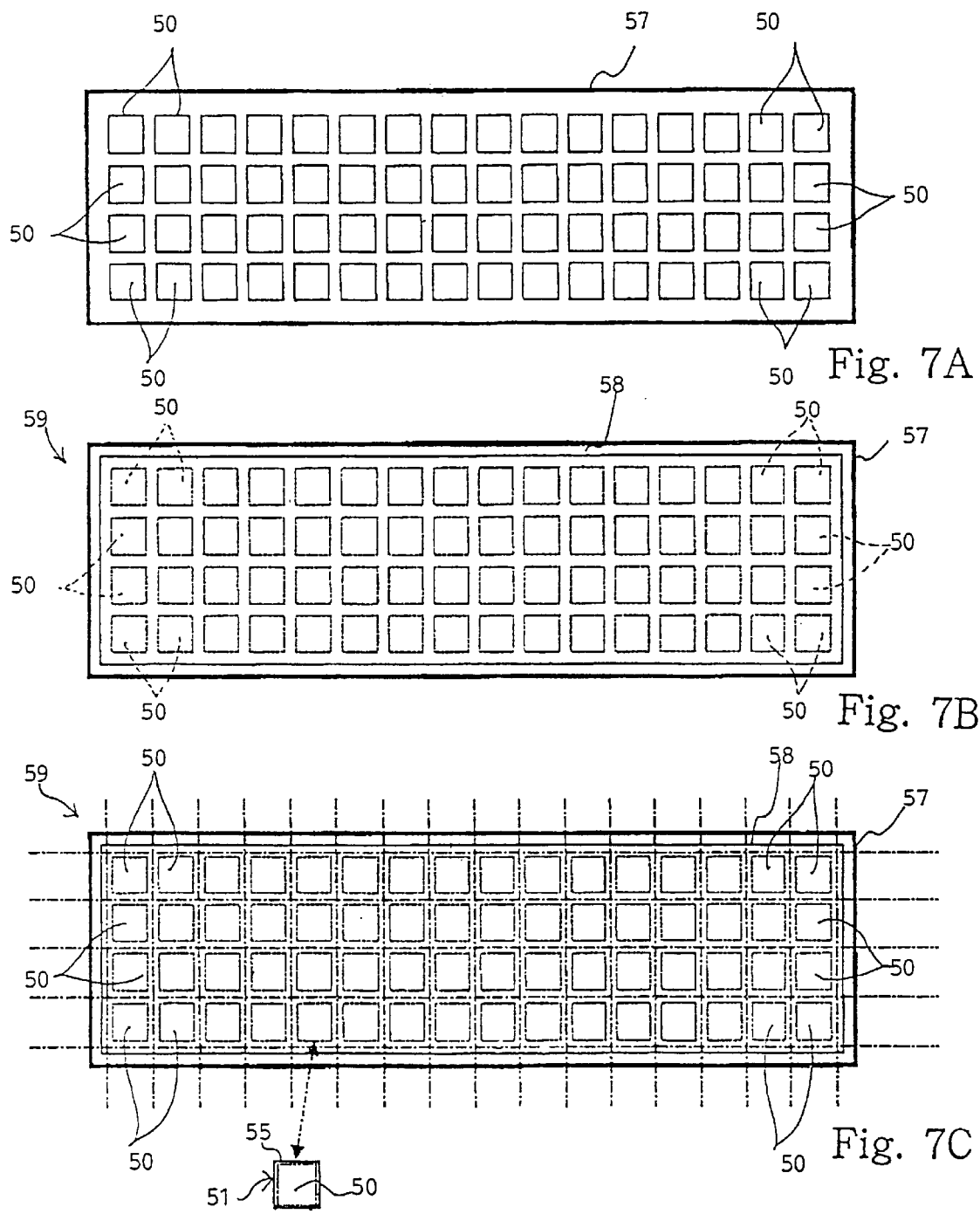
FIGS. 7A to 7C are plane views showing a process for fabricating the semiconductor device according to the present invention.

The piece of synthetic resin 55 has a bottom surface 55a held in contact with the entire exposed surface of the substrate 53, a top surface 55b extending substantially in parallel to the substrate 53 and side surfaces 55c. The top surface 55b is as wide as the substrate 53, and, accordingly, the side surfaces 55c are substantially perpendicular to the insulating tape 53a. Thus, the piece of synthetic resin 55 is a rectangular parallelepiped configuration. The area occupied by the side surfaces 55c is approximately equal to zero, and the piece of synthetic resin 55 is smaller in volume than the piece of synthetic resin used in the prior art semiconductor device. Though not shown in FIG. 6, an alignment mark is formed on the piece of synthetic resin 55. The semiconductor device is fabricated as follows. FIGS. 7A to 7C show a process for fabricating the semiconductor device. The process starts with preparation of a panel 57. The panel 57 is a set of substrates 53. The conductive pattern 53b is repeatedly formed on a long insulating tape. The semiconductor chips 50 are bonded to the panel 57 like an array as shown in FIG. 7A. The gap between the semiconductor chips 50 is narrower than the gap between the semiconductor chips 12 shown in FIG. 1B. This is because of the fact that an extremely thin rotating disk blade is used for separation after a molding. The bonding wires 52 are connected to the conductive pattern 53b around each of the semiconductor chips 50. For this reason, the semiconductor chips 50 are spaced to the extent permitting a bonding machine to connect the conductive wires 52 to the conductive patterns 53b and the rotating disk blade to pass between the adjacent conductive patterns 53b.

If the semiconductor device is a facedown type connecting the semiconductor chip 50 to the conductive pattern 53b by means of bumps, the manufacturer makes the gap narrower. The manufacturer makes the gap as narrow as possible in so far as the synthetic resin flows into the gap between the semiconductor chips 50.

Subsequently, the semiconductor chips 50 are sealed in the synthetic resin together. A transfer molding may be used for sealing the semiconductor chips 50 in the synthetic resin. A molding die is prepared, and the resultant structure shown in FIG. 7A is put into a cavity of the die. Melted synthetic resin is introduced into the cavity, and is cooled. As a result, the semiconductor chips 50 on the panel 57 are covered with a large piece 58 of the synthetic resin as shown in FIG. 7B. The panel, the semiconductor chips 50 and the large piece 58 of synthetic resin as a whole constitute a package panel 59.

Figure 8:
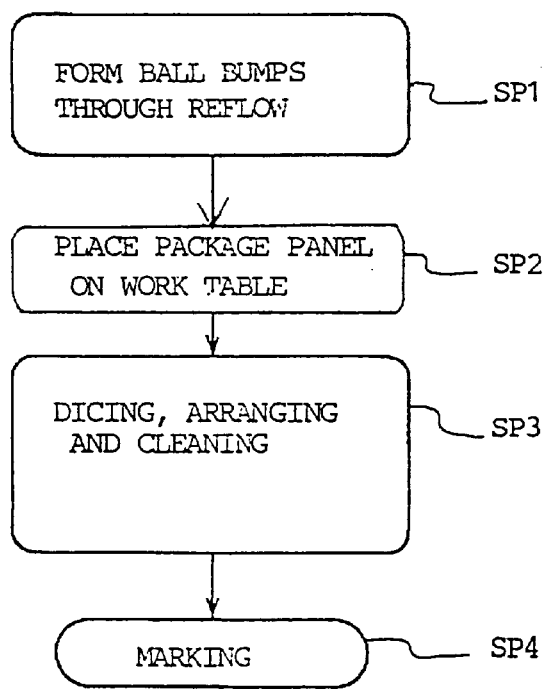
FIG. 8 is a flow chart showing steps after a molding.
Figure 9:
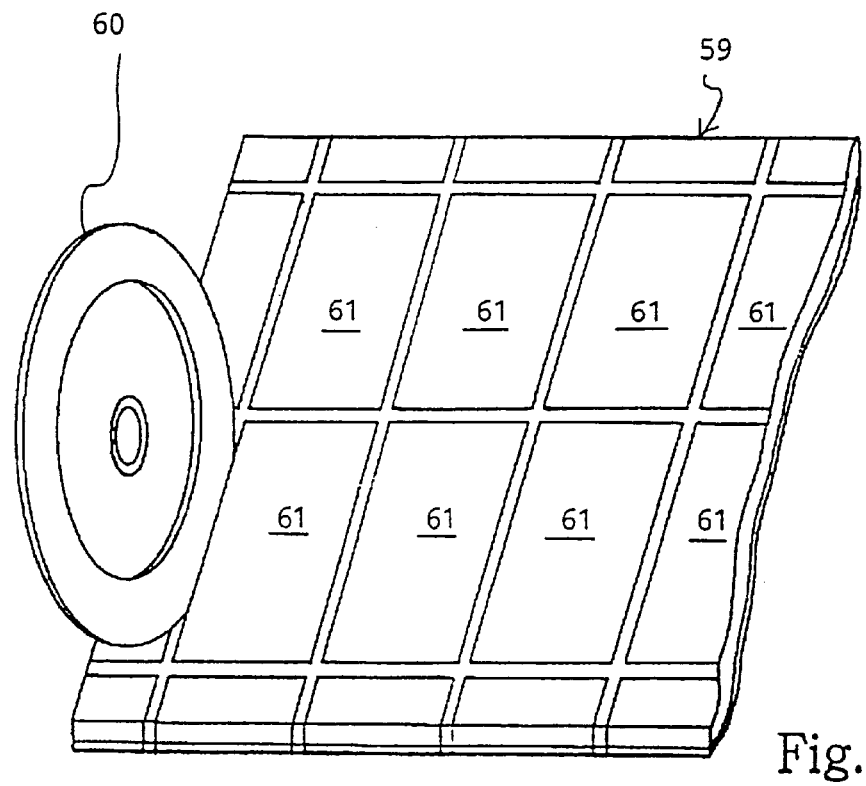
FIG. 9 is a perspective view showing a dicing step.

Subsequently, the manufacturer carries out a series of steps shown in FIG. 8. First, ball bumps 54 are formed on the reverse surface of the package panel 59 as by step SP1. Pieces of solder are provided on the reverse surface of the package panel 59, and are formed into ball bumps 54 through a reflow as by step SP1. The package panel 59 is placed on a worktable of a dicing machine as by step SP2. Using a rotating disk blade 60, the manufacturer cuts the package panel 59 (see FIG. 9) into dices 61 along cutting lines indicated by dot-and-dash lines (see FIG. 7C), arranges the dices 61, and washes away flux from the dies 61 as by step SP3. While the dicing machine is cutting the package panel 59 with the rotating disk blade, cold water is supplied to the cutting surface, and washes away flux. Thus, the dicing and the washing are concurrently carried out. Each of the dices 61 serves as the semiconductor device. Finally, the dices 61 are marked as by step SP4.

The rotating disk blade 60 is a kind of grinding wheel, and is of the order of 150 microns wide. Thus, the rotating disk blade 60 is much narrower than the area pinched between the upper die 12a and the lower die 12b. For this reason, scrap is negligible. This results in reduction of the production cost.

Figure 10A:
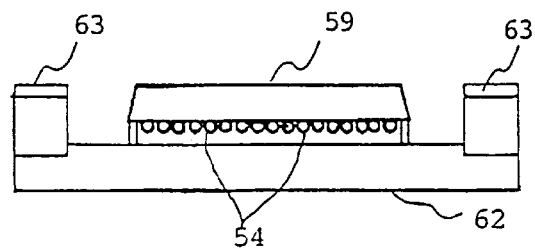
FIGS. 10A to 10I are schematic views showing the steps between formation of ball bumps and a marking step.
Figure 10B:
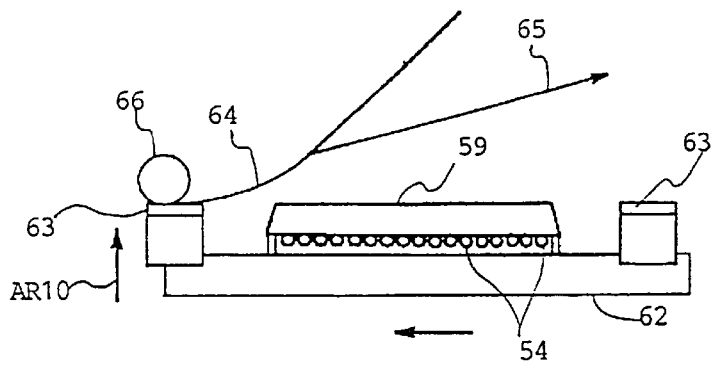

The step SP3 is described in detail with reference to FIGS. 10A to 10I. When the ball bumps 54 are formed on the reverse surface of the package panel 59, the package panel 59 is, by way of example, caught by a vacuum pincette or other clamping means, and is conveyed to a work table 62. The package panel 59 is placed on the worktable 62, and a frame carrier 63 is provided on the worktable 62 as shown in FIG. 10A. An adhesive sheet 64 peels from a backing strip 65, and the worktable 62 is upwardly moved as indicated by arrow AR10. The adhesive sheet 64 is brought into contact with the frame carrier 63, and a roller 66 presses the adhesive sheet 64 to the frame carrier 63 as shown in FIG. 10B. The adhesive sheet 64 has a layer of adhesive compound. When ultra-violet light is radiated onto the adhesive compound, it loses the adhesion. The adhesion before the radiation with the ultra violet light is equal to or greater than 100–200 grams/25 mm. However, the adhesion is reduced to 10–40 grams/25 mm through the radiation with the ultra violet light UV.

Figure 10C:
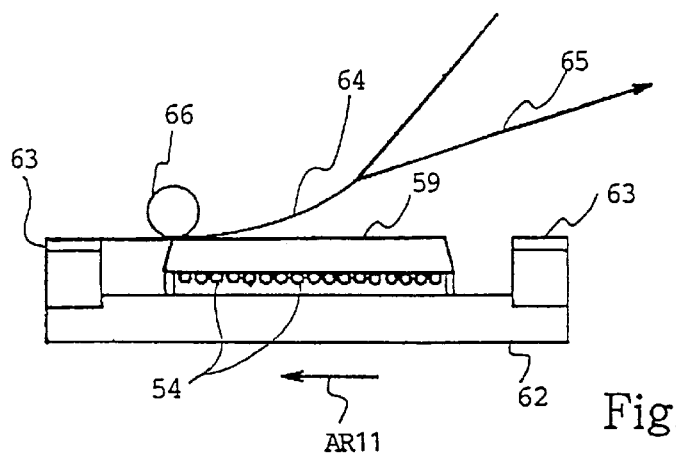
Figure 10D:
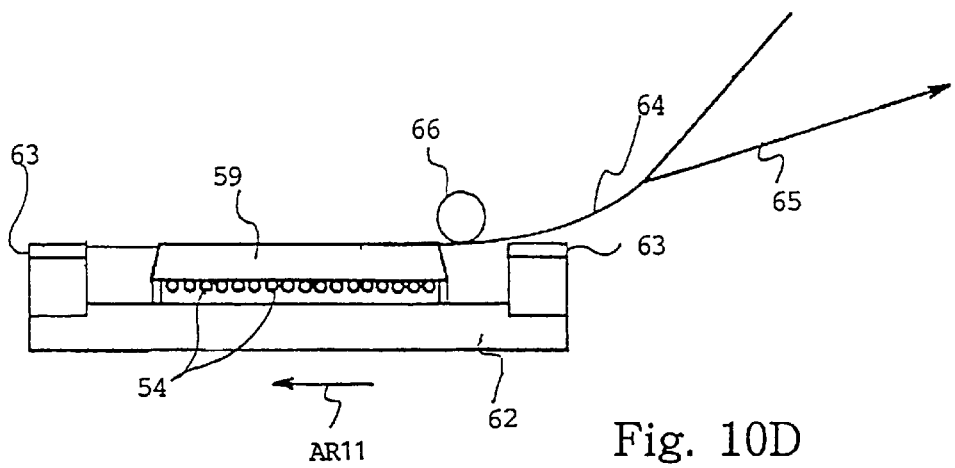
Figure 10E:
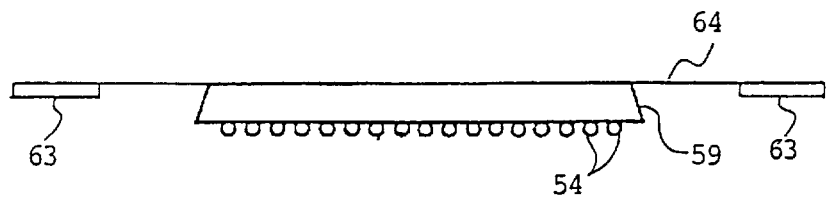
Figure 10F:
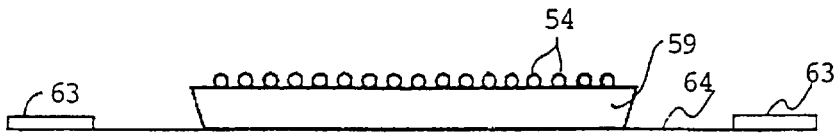

The worktable 62 is moved in a direction indicated by arrow AR11, and the package panel 59 is adhered to the adhesive sheet 64 as shown in FIGS. 10C and 10D. When the adhesive sheet 64 reaches the other frame carrier 63, the frame carriers 63 lift the adhesive sheet 64 together with the package panel 59 as shown in FIG. 10E, and turn the adhesive sheet 64 and, accordingly, the package panel 59 as shown in FIG. 10F. The package panels 59 adhered to the adhesive sheet 64 are stored in a cassette case (not shown).

The package panel 59 is taken out from the cassette case by means of a suitable chuck (not shown), and is moved to a positioning stage (not shown).

The package panel 59 is moved to the dicing machine together with the frame carriers 63 and the adhesive sheet 64. An operator has instructed the distances between the alignment marks and the cutting lines (see FIG. 7C), and the dicing machine can move the rotating disk blade 60 along the cutting lines. The dicing machine is equipped with a camera for an image recognition. The camera has an automatic focusing mechanism, and the focus depth is equal to or greater than 1 millimeter. The focus depth is desirable, because the package panel 59 is sometimes warped.

Figure 10G:
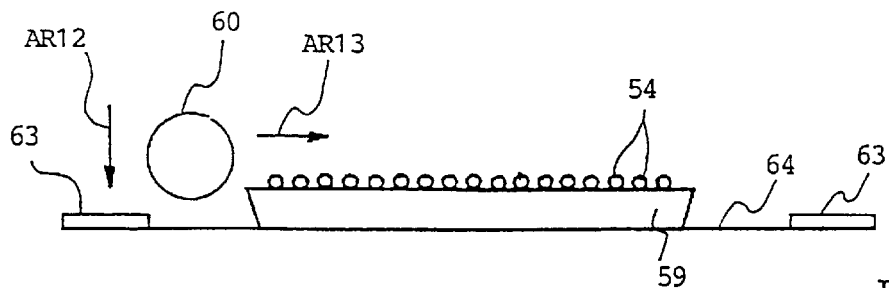

The dicing machine recognizes the alignment marks on the package panel 59 through the camera, and determines the cutting lines on the package panel 59. The positioning stage is movable in a direction normal to the paper where FIGS. 10E to 10I are illustrated. The dicing machine moves the rotating disk blade 60, and aligns the rotating disk blade 60 with one of the cutting lines. The rotating disk blade 60 is downwardly moved as indicated by arrow AR12, and is further moved as indicated by arrow AR13 as shown in FIG. 10G. The rotating disk blade 60 is brought into contact with the package panel 59, and the package panel 59 is cut along one of the cutting lines. While the dicing machine cuts the package panel 59 with the rotating disk blade 60, cold water is injected to the rotating disk blade 60, and washes away the flux.

The dicing machine repeats the alignment between the rotating disk blade 60 and the other cutting lines, and the package panel 59 is separated into the dices 61.

Figure 10H:
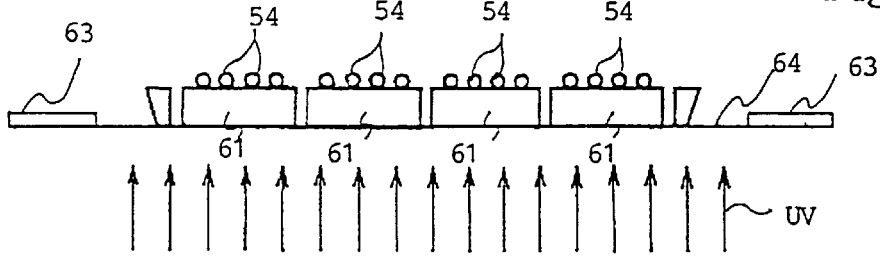
Figure 10I:
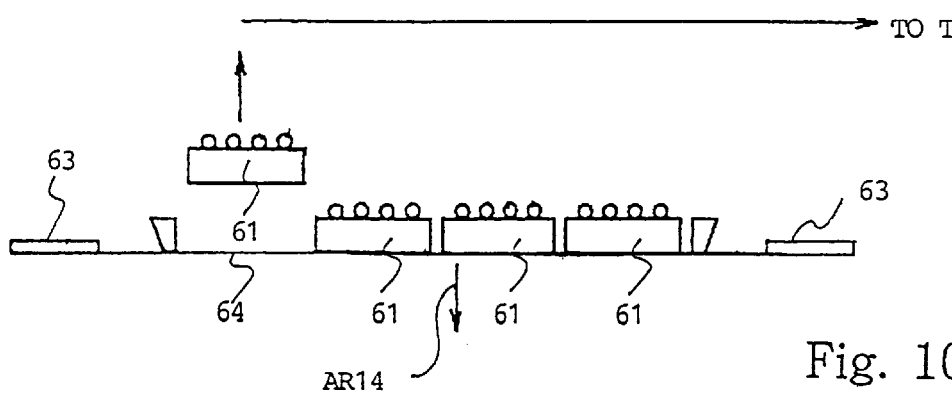

After the dicing, the dices 61 are dried, and the adhesive sheet 64 is radiated with ultra-violet light UV as shown in FIG. 10H. The adhesive layer 64 is cured, and loses the adhesion. The adhesive sheet 64 is moved to a pickup stage, and a sponge pad (not shown) attracts the adhesive sheet 64 as indicated by arrow AR14. The dice 61 peels from the adhesive sheet 64, and is conveyed to a tray (not shown) as shown in FIG. 10I.

As will be understood from the foregoing description, the rotating disk blade 60 consumes narrow areas each as narrow as the width of the rotating disk blade 60. As a result, the manufacturer can arrange a large number of semiconductor chips 50 on the elongated panel 57. In other words, the expensive panel 57 is shared between the semiconductor chips 50, and the production cost is reduced. Conventionally, a manufacturer arranges semiconductor chips in 3×18 matrix on a panel. When the manufacturer arranges the semiconductor chips on the same panel through the process according to the present invention, the matrix has 5 rows and 57 columns, and the production cost is surely reduced. The present inventor confirmed that the semiconductor chips were 1.5–2.0 times more cost efficient than the prior art.

Moreover, the rotating disk blade 60 separates the package panel 59 into the dices 61 through the grinding, and prohibits the large piece 58 of synthetic resin equal to or greater than 0.3 millimeter thick from pitching. The adhesive sheet 64 is equal to or greater in adhesion than 200 grams/25 mm, and keeps the package panel 59 stable during the separation with the rotating disk blade 60. The stability of the package panel 59 prevents the large piece of synthetic resin 58 from the pitching.

The adhesive sheet 64 protects the dies 61 from contamination due to the particles produced by the rotating disk blade 60, because there is not any gap between the large piece of synthetic resin 58 and the adhesive sheet 64.

The large adhesion before the radiation with the ultra violet light UV prohibits the dices 61 from undesirable separation from the adhesive sheet 64. However, the adhesive sheet 64 loses the adhesion through the radiation with the ultra violet light UV. For this reason, the dices 61 are easily separated from the adhesive sheet 64.

The auto focusing mechanism has the focus depth equal to or greater than 1 millimeter. This feature is desirable, because the dicing machine accurately aligns the rotating disk blade 60 with the cutting lines regardless of the warp due to the shrinkage of the piece of synthetic resin.

Plural semiconductor chips 50 are concurrently sealed in the large piece of synthetic resin. As a result, the molding step becomes simple. Even if the semiconductor chips 50 are different in size from the semiconductor chips usually molded by using the die, the manufacturer does not change the die in so far as the semiconductor chips 50 are arranged on the same panel. In other words, the die is available for the semiconductor chips different in size. This results in reduction in production cost.

Although particular embodiments of the present invention have been shown and described, it will be apparent to those skilled in the art that various changes and modifications may be made without departing from the spirit and scope of the present invention.

For example, the flux may be washed away between the dicing and radiation with the ultra violet light. In this instance, the frame carriers 63 is moved to a cleaning stage together with the dices 61 still adhered to the adhesive sheet 64. After the cleaning, the cleaning stage is rotated for wiping and drying.

A laser beam machine and an electrical discharge machine are available for the dicing. The polyimide tape may be replaced with a sheet of glass fiber reinforced epoxy resin. The sealing step is not limited to the transfer molding. The adhesive sheet sensitive to the ultra violet light is not the essential feature of the present invention. Any kind of adhesive sheet is available. The package panel 59 may be cut on a jig without the adhesive sheet.

The piece 55 of synthetic resin may be chamfered. In this instance, shallow grooves are formed on the large piece 58 of synthetic resin along the cutting lines before the dicing. When the package panel 59 is separated into the dices 61, the shallow grooves make the edge lines of the piece 55 of synthetic resin round.

What is claimed is:

1. A process for fabricating a semiconductor device, comprising the steps in sequence of:
   a) arranging a plurality of semiconductor chips in a matrix of columns and rows on a panel, wherein adjacent two of said semiconductor chips are spaced from one another by a gap, and each of said semiconductor chips is connected through bonding wires to conductive patterns formed in said matrix on said panel;
   b) covering said semiconductor chips with a piece of synthetic resin so as to produce a package panel; and
   c) forming conductive solder bumps on a reverse surface of said panel electrically connected through said conductive patterns and said bonding wires to said semi-conductive chips; and
   d) separating said package panel into semiconductor devices using a water-cooled rotating disk blade to cut along lines between the rows and the columns of said semiconductor chips, said water also serving to remove water soluble flux residues present on said chips.

2. The process as set forth in claim 1, in which said gap is regulated in such a manner that melted synthetic resin flows thereinto in said step b).

3. The process as set forth in claim 2, in which each of said semiconductor chips is connected through bonding wires to one of said plural conductive patterns exposed to said gap.

4. The process as set forth in claim 2, in which said step b) includes the sub-steps of b-1) preparing a die having a cavity, b-2) placing said semiconductor chips mounted on said panel into said cavity, b-3) introducing said melted synthetic resin into said cavity, and b-4) solidifying said melted synthetic resin.

5. The process as set forth in claim 2, in which said step d) includes the sub-steps of d-1) placing said package panel on a movable stage, d-2) determining cutting lines respectively passing the gaps between the rows of semiconductor chips and between the columns of semiconductor chips, and d-3) cutting said package panel along said cutting lines with a rotating disk blade.

6. The process as set forth in claim 5, in which said rotating disk blade has a width of the order of 150 microns.

7. The process as set forth in claim 3, in which said step d) includes the sub-steps of d-1) placing said package panel on a movable stage, d-2) determining cutting lines respectively passing the gaps between the rows of semiconductor chips and between the columns of semiconductor chips, and d-3) cutting said package panel along said cutting lines with a rotating disk blade.

8. The process as set forth in claim 7, in which said cutting lines pass between the rows of conductive patterns and between the columns of conductive patterns.

9. The process as set forth in claim 5, in which said rotating disk blade has a width of the order of 150 microns.

10. The process as set forth in claim 7, in which said sub-step d-1) has the sub-steps of d-1-1) adhering said package panel to an adhesive sheet extending between frame carriers, d-1-2) conveying said package panel adhered to said adhesive sheet extending between said frame carriers to said movable stage, and d-1-3) placing said adhesive sheet on said movable stage in such a manner that said package panel overlies said adhesive sheet.

11. The process as set forth in claim 10, in which said adhesive sheet reduces the adhesion through an exposure to ultra violet light.

12. The process as set forth in claim 11, in which said step d) further comprising the sub-step of d-4) exposing said adhesive sheet to a radiation of ultra violet light, and d-5) peeling said package panel from said adhesive sheet.

13. The process as set forth in claim 11, in which said adhesion before said exposure to said ultra violet light is equal to or greater than 200 grams/25 mm.

* * * * *

UNITED STATES PATENT AND TRADEMARK OFFICE
CERTIFICATE OF CORRECTION

PATENT NO. : 6,180,435 B1
DATED : January 30, 2001
INVENTOR(S) : Ise et al.

Page 1 of 1

It is certified that error appears in the above-identified patent and that said Letters Patent is hereby corrected as shown below:

Column 10,
Line 4, change "5" to -- 8 --.

Signed and Sealed this

Fourteenth Day of May, 2002

Attest:

*Attesting Officer*

JAMES E. ROGAN
*Director of the United States Patent and Trademark Office*